United States Patent
Miyata et al.

(10) Patent No.: US 9,552,987 B2
(45) Date of Patent: Jan. 24, 2017

(54) SUBSTRATE PROCESSING METHOD, SUBSTRATE PROCESSING APPARATUS, AND STORAGE MEDIUM

(71) Applicant: TOKYO ELECTRON LIMITED, Tokyo (JP)

(72) Inventors: Yuichiro Miyata, Koshi (JP); Keiichi Tanaka, Nirasaki (JP); Kenichi Ueda, Koshi (JP); Takahiro Shiozawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/297,661

(22) Filed: Jun. 6, 2014

(65) Prior Publication Data
US 2014/0363976 A1 Dec. 11, 2014

(30) Foreign Application Priority Data
Jun. 10, 2013 (JP) .................................. 2013-122058

(51) Int. Cl.
| H01L 21/311 | (2006.01) |
| H01L 21/302 | (2006.01) |
| H01L 21/461 | (2006.01) |
| B44C 1/22 | (2006.01) |
| H01L 21/027 | (2006.01) |
| H01L 21/02 | (2006.01) |
| H01L 21/67 | (2006.01) |
| G03F 7/42 | (2006.01) |
| H01L 21/768 | (2006.01) |

(52) U.S. Cl.
CPC ........... *H01L 21/0273* (2013.01); *G03F 7/422* (2013.01); *H01L 21/02065* (2013.01); *H01L 21/31133* (2013.01); *H01L 21/6715* (2013.01); *H01L 21/67115* (2013.01); *H01L 21/7684* (2013.01); *H01L 2224/11916* (2013.01)

(58) Field of Classification Search
None
See application file for complete search history.

(56) References Cited

U.S. PATENT DOCUMENTS

| 2010/0086882 A1* | 4/2010 | Murakami et al. ........... 430/331 |
| 2010/0261122 A1* | 10/2010 | Inatomi ........................ 430/325 |
| 2012/0225389 A1* | 9/2012 | Kobayashi ................... 430/432 |
| 2013/0008868 A1* | 1/2013 | Uozumi .................. G03F 7/162 216/41 |

FOREIGN PATENT DOCUMENTS

| JP | 4328667 B2 | 6/2009 |
| JP | 2012-185222 A | 9/2012 |

* cited by examiner

*Primary Examiner* — Stephanie Duclair
(74) *Attorney, Agent, or Firm* — Nath, Goldberg & Meyer; Jerald L. Meyer

(57) ABSTRACT

A substrate processing method is performed to improve surface roughness of a pattern mask formed on a substrate by being exposed and developed. The method includes supplying a first solvent in a gaseous state to a surface of the substrate to dissolve the pattern mask, and supplying a second solvent to the surface of the substrate, which is supplied with the first solvent, to dissolve the pattern mask, wherein a permeability of the second solvent is lower than a permeability of the first solvent.

11 Claims, 16 Drawing Sheets

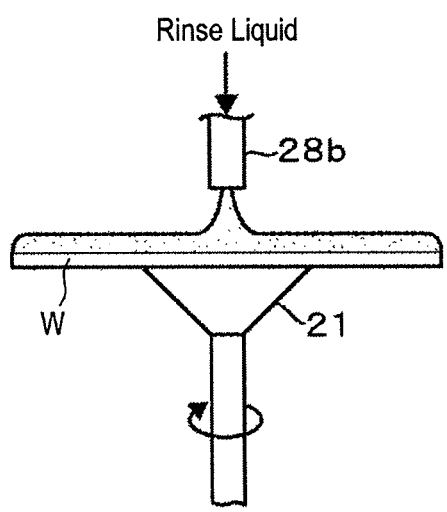

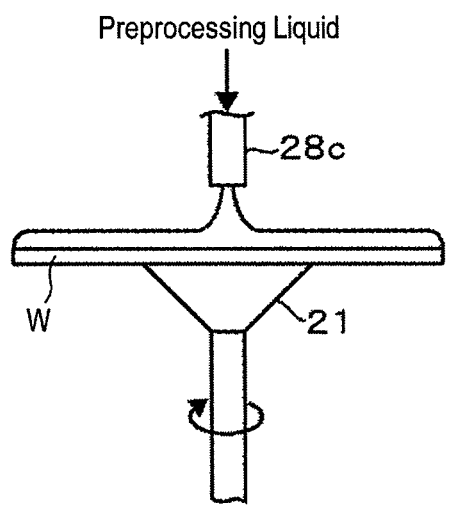

First Solvent Gas

Applying Preprocessing Agent →

SUBSTRATE PROCESSING METHOD, SUBSTRATE PROCESSING APPARATUS, AND STORAGE MEDIUM

CROSS-REFERENCE TO RELATED APPLICATION

This application claims the benefit of Japanese Patent Application No. 2013-122058, filed on Jun. 10, 2013, in the Japan Patent Office, the disclosure of which is incorporated herein in its entirety by reference.

TECHNICAL FIELD

The present disclosure relates to a substrate processing method, a substrate processing apparatus and a non-transitory computer-readable storage medium for improving surface roughness of a pattern mask formed on a substrate.

BACKGROUND

In a process of manufacturing a semiconductor device, an LCD substrate, or the like, a resist liquid is applied to a surface of a substrate, e.g., a semiconductor wafer (hereinafter, referred to as "wafer"), exposed, and then, developed, so as to form a resist pattern as a pattern mask on the wafer surface. In the related art, it has been well known that a surface of the resist pattern has fine unevenness, which may unfavorably influence a pattern line width when an etching process is performed as a subsequent process. Accordingly, a smoothing process for improving a roughness of the pattern line width (LWR: Line Width Roughness) of the resist pattern has been proposed.

The smoothing process is performed, for example, by forming a solvent vapor atmosphere for dissolving the resist in a processing chamber, exposing the resist pattern to such an atmosphere, and dissolving a surface layer of the resist pattern. Accordingly, the surface layer is dissolved by the solvent and planarized, and the pattern surface roughness is improved to correct a pattern shape.

However, in the smoothing process, the resist pattern may be excessively dissolved by the solvent, and thereby breaking the resist pattern, when a try to increase an improvement rate of the LWR is made with respect to, e.g., a resist pattern containing a frail portion. To address this, the related art discloses a method in which the roughness is uniformly improved in a wafer surface by independently using both a process of evacuating surroundings of a wafer and a process of forming a temperature gradient having a higher temperature at a central portion of the wafer surface. In this case, however, throughput may be adversely affected due to repetition of the dissolving and the drying the resist pattern surface. In addition, a more enhanced method which can suppress the breakdown of the resist pattern has been required.

SUMMARY

Some embodiments of the present disclosure provide a substrate processing method, a substrate processing apparatus and a non-transitory computer-readable storage medium, in which surface roughness of a pattern mask formed on a substrate can be improved while breakdown of the pattern mask can be prevented.

According to one aspect of the present disclosure, provided is a substrate processing method performed to improve surface roughness of a pattern mask formed on a substrate by being exposed and developed, the method including: supplying a first solvent in a gaseous state to a surface of the substrate to dissolve the pattern mask, and supplying a second solvent to the surface of the substrate, which is supplied with the first solvent, to dissolve the pattern mask, wherein a permeability of the second solvent is lower than a permeability of the first solvent.

According to another aspect of the present disclosure, provided is a substrate processing apparatus configured to improve surface roughness of a pattern mask formed on a substrate by being exposed and developed, the apparatus including: a first processing chamber provided with a first mounting unit to be mounted with the substrate, a first solvent supply unit configured to supply the substrate mounted on the first mounting unit with a first solvent in a gaseous state for dissolving the pattern mask, a second processing chamber provided with a second mounting unit to be mounted with the substrate, and a second solvent supply unit configured to supply the substrate mounted on the second mounting unit in the second processing chamber with a second solvent for dissolving the pattern mask, wherein a processing condition is set such that dissolving the substrate by the second solvent is performed under conditions where a permeability of the second solvent to the pattern mask is lower than dissolving the substrate by the first solvent.

According to still another aspect of the present disclosure, provided is a non-transitory computer-readable storage medium configured to store a computer program to be used in a substrate processing apparatus configured to improve surface roughness of a pattern mask formed on a substrate by being exposed and developed, wherein the computer program performs the above method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 1A to 1C are schematic views of processes in a development module according to a first embodiment.

DETAILED DESCRIPTION

Hereinafter, embodiments of a method of the present disclosure and an apparatus configured to perform the method will be described in this order. Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<First Embodiment>

A first embodiment of the present disclosure will be described with reference to FIGS. 1A to 3.

Figure 1A:
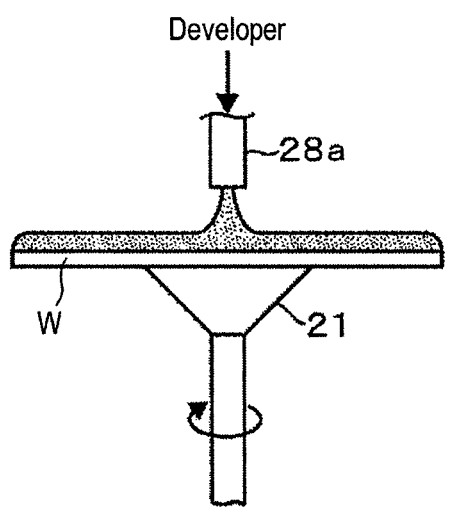

A wafer W subjected to a coating process and an exposure process of a resist is held by a spin chuck 21, which is a substrate holding unit in a development module 20. Next, while a developer is ejected from a developer nozzle 28a, as shown in FIG. 1A, for example, an ejection position thereof is moved from a peripheral portion of the wafer W to a central portion thereof in the shape of a vortex, thereby coating the developer to a surface of the wafer W. Then, as shown in FIG. 1B, while rotating the spin chuck 21, a rinse liquid, e.g., pure water, is ejected from a rinse liquid nozzle 28b onto the central portion of the surface of the wafer W to clean the surface of the wafer W. Then, in the development module 20, as shown in FIG. 1C, while rotating the spin chuck 21, a preprocessing agent (or referred as "preprocessing liquid") is ejected from a preprocessing agent nozzle 28c onto the central portion of the wafer W to be spread thinly and widely over the entire surface of the wafer W, and a surplus preprocessing agent is casted off. The preprocessing agent includes, for example, a tetraalkyl ammonium-based quaternary cation (TAAH). In such a case, a carboxylic group (COOH) of the developed resist and an OH group of the TAAH are bonded, thereby forming a TAAH liquid film on the surface of the resist pattern, as described later.

Subsequently, the wafer W is transferred from the development module 20 to a planarization processing module 30 and is loaded on a mounting table 10 in the planarization processing module 30. The wafer W is heated by a heater (not shown) which is a heating unit installed in the mounting table 10. Although a heating temperature of the wafer W is set depending on the type of the preprocessing agent used in the development module 20, the heating temperature is set, for example, to 10 to 50 degrees C. when TAAH is used as the preprocessing agent.

A state of the resist pattern when the process is performed so far is shown in FIGS. 3A to 3D.

Figure 3A:
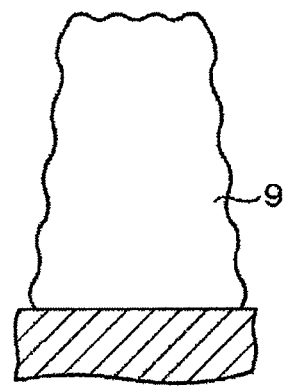
FIGS. 3A to 3D are schematic diagrams showing a change in the surface of a resist pattern when supplying a preprocessing agent.
Figure 3B:
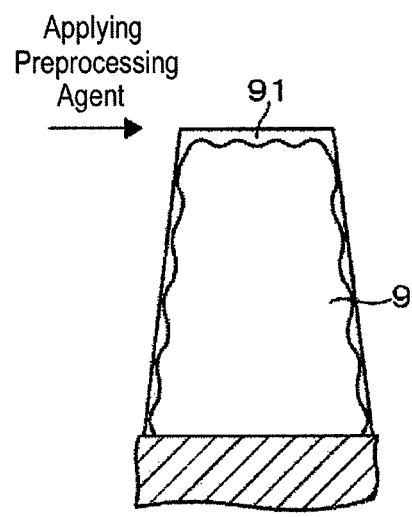
Figure 3C:
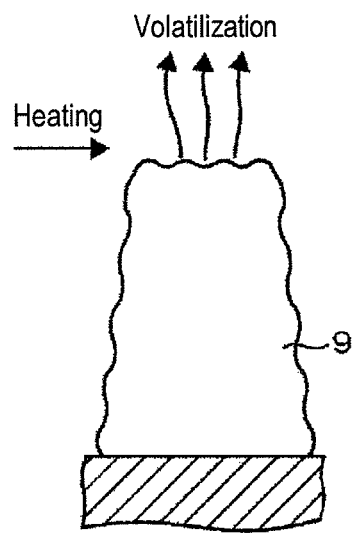
Figure 3D:
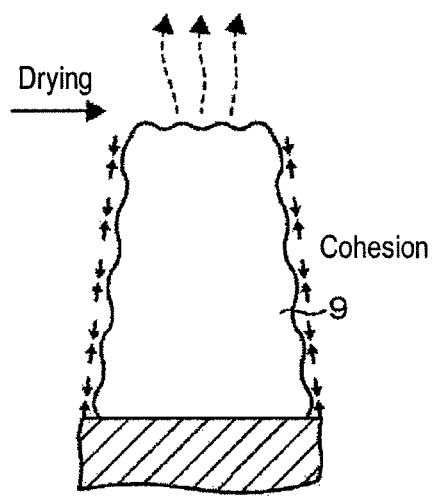

A resist pattern 9 immediately after the development processing is performed has a surface that is not uniform and uneven, as shown in FIG. 3A. FIG. 3B shows a state where the preprocessing agent is attached onto the resist pattern 9. Next, by heating the wafer W, as shown in FIG. 3C, a liquid film 91 begins to be volatilized. Further, if the heating is continued, molecules in the surface of the resist pattern 9 are attracted to each other due to cohesive force when the liquid film 91 is volatilized, as shown in FIG. 3D, and a degree of surface unevenness (roughness) of the resist pattern 9 becomes small.

The preprocessing agent is, in some embodiments, a substance that can be bonded with a carboxyl group (COOH) of the developed resist pattern 9, e.g., a substance having basicity (—OH). Further, in order to suppress a permeation into the resist pattern 9 and a dissolution reaction with the resist pattern 9, the preprocessing agent in some embodiments has a steric structure to have a high molecular weight. In addition, the preprocessing agent in some embodiments has an acid dissociation constant that is significantly different from that of the resist in order to promote adsorption onto the resist pattern 9. Furthermore, since the preprocessing agent is attached onto the surface of the resist pattern 9 to form the liquid film 91, a lower surface tension is preferable and therefore, a nonionic surfactant may be added. An example of the preprocessing agent includes ethyl lactate, a tetraalkyl ammonium-based quaternary cation such as a tetrabutyl ammonium hydroxide (TBAH), a tetraethyl ammonium hydroxide (TEAH), or a tetrapropyl ammonium hydroxide (TPAH), and the like. An example of the nonionic surfactant includes polyoxyalkyl ether, sorbitan fatty acid ester, alkylpolyglucoside, fatty acid diethanolamide, alkyl-monoglyceryl ether and the like.

Then, a first planarization process as the first process is performed on the resist pattern 9 of the heated wafer W. This process is to supply the surface of the wafer W with a first solvent having a property of dissolving the resist pattern 9, e.g., NMP (N-methylpyrrolidone) gas, from a shower head 40 while the wafer W is mounted on the mounting table 10, as shown in FIG. 2B. A surface layer of the resist pattern 9 is dissolved by the NMP. The shower head is a gas supply member having a plurality of gas ejection holes in a bottom surface thereof. Here, the temperature of the wafer W is adjusted, for example, to 10 to 100 degrees C., which is higher than the dew point of the NMP and lower than the boiling point of the NMP. After the surface layer of the resist pattern is dissolved, an atmosphere of the NMP is substituted by an atmosphere of an inert gas, e.g., nitrogen gas, and as shown in FIG. 2C, the wafer W is heated at a temperature, for example, of 50 to 250 degrees C., by the heater in the mounting table 10, thereby volatilizing the NMP.

Figure 2A:
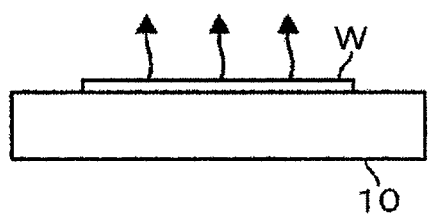
FIGS. 2A to 2E are schematic views of processes in a dissolution processing module according to the first embodiment.
Figure 2B:
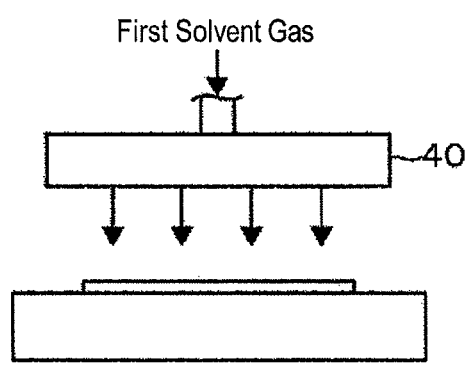
Figure 2C:
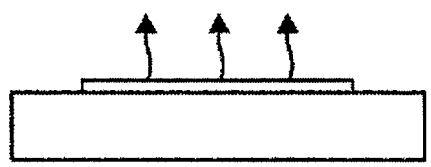
Figure 4A:
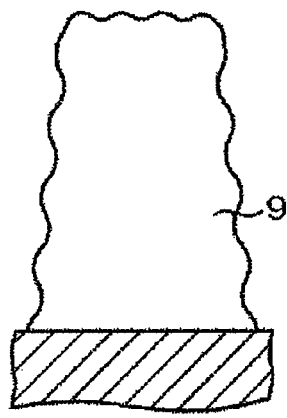
FIGS. 4A to 4C are schematic diagrams showing a change in the surface of the resist pattern in a first planarization process.
Figure 4B:
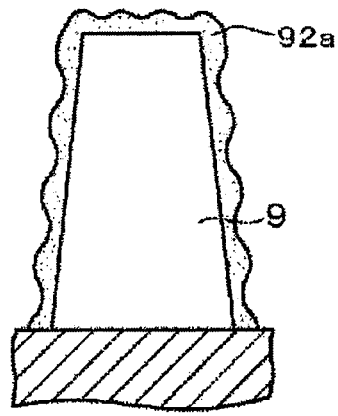
Figure 4C:
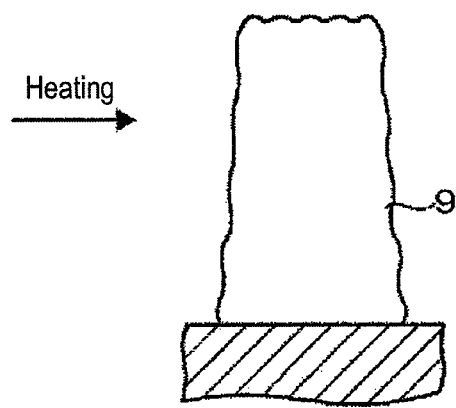

A change in the surface of the resist pattern 9 in the first planarization process from FIGS. 2A to 2C is shown in FIGS. 4A to 4C.

FIG. 4A shows a surface state of the resist pattern 9 after the preprocessing is terminated. It is assumed that, if the surface of the resist pattern 9 is supplied with the NMP, a phenomenon in which NMP molecules collide with the surface of the resist pattern 9 and thus the surface is dissolved by the solvent (the surface layer is swelled) and a phenomenon in which the NMP is volatilized from the surface by the heat of the wafer W are repeated. As the dissolution by the NMP and the volatilization of the NMP are repeated, the resist film in a surface layer 92a is softened and dissolved by the NMP so that it flows. However, since the temperature of the wafer has been set such that the agent liquid is volatilized before it permeates the inside of the resist pattern 9, the NMP is prevented from permeating the inside of the resist pattern 9. Accordingly, as shown in FIG. 4B, only the surface layer 92a of the resist pattern 9 absorbs the NMP and is dissolved.

In addition, since the heating the wafer W is performed at the time when only the surface layer 92a of the resist pattern 9 is appropriately dissolved, the NMP is volatilized from the surface layer 92a of the resist pattern 9 so that the surface of the resist pattern 9 is more planarized, as shown in FIG. 4C.

Figure 2D:
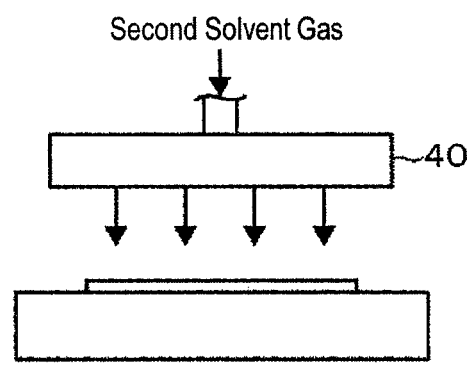

Then, a second planarization process as the second process is performed on the wafer W in the planarization processing module 30. The second planarization process includes a dissolution process performed on the resist pattern 9 under conditions of lower permeability of a solvent as compared with the dissolution of the resist pattern 9 by the first solvent performed in the first planarization process. In this example, ethyl lactate is used as a second solvent in the second planarization process, which is difficult to permeate the resist pattern 9 as compared with the NMP that is the first solvent. In this dissolution process, as shown in FIG. 2D, an ethyl lactate gas is supplied onto the surface of the wafer W as the second solvent from the shower head 40, to dissolve the surface layer of the resist pattern 9. Here, the wafer W has a temperature adjusted, for example, to 10 to 100 degrees C., which is higher than the dew point of the ethyl lactate and lower than the boiling point of the ethyl lactate, by the heater of the mounting table 10. Thereafter, as shown in FIG. 2E, the wafer W is heated again by the heater or the like.

Figure 2E:
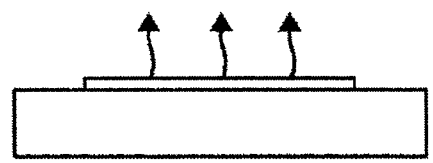
Figure 5A:
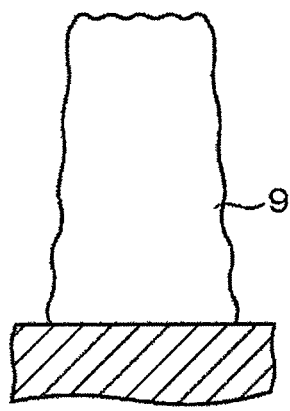
FIGS. 5A to 5C are schematic diagrams showing a change in the surface of the resist pattern in a second planarization process.
Figure 5B:
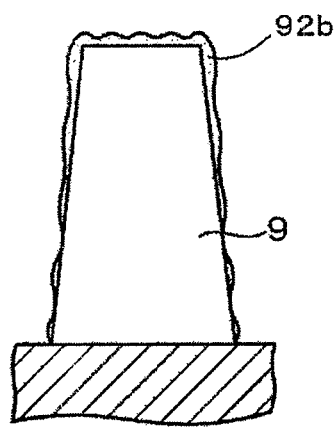
Figure 5C:
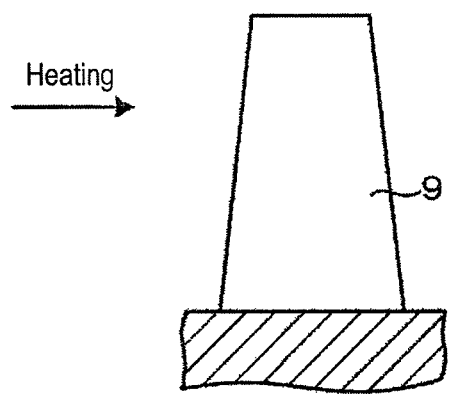

A change in the resist pattern surface in the second planarization process in FIGS. 2C to 2E is shown in FIGS. 5A to 5C.

FIG. 5A shows a surface state of the resist pattern 9 after the first planarization process is terminated. If the surface of the resist pattern 9 is supplied with the ethyl lactate, it is assumed that a phenomenon in which molecules of the ethyl lactate collide with the surface of the resist pattern 9 and thus the pattern surface is dissolved by the solvent (the surface layer is swelled) and a phenomenon in which the ethyl lactate is volatilized from the resist pattern surface by the heat of the wafer W are repeated. As the dissolution by the ethyl lactate and the volatilization of the ethyl lactate are repeated, the resist film in a surface layer 92b is softened and dissolved by the ethyl lactate so that it flows. However, since the wafer temperature has been set so that the agent liquid is volatilized before the ethyl lactate permeates the inside of the resist pattern 9, the ethyl lactate is prevented from permeating the inside of the resist pattern 9. Accordingly, as shown in FIG. 5B, only the surface layer 92b of the resist pattern 9 absorbs the ethyl lactate and is dissolved.

In addition, by heating the wafer W, at the time when only the surface layer 92b of the resist pattern 9 is appropriately dissolved, the ethyl lactate is volatilized from the surface layer 92b of the resist pattern 9. Accordingly, after the strong dissolution process is performed on the resist pattern, a weak dissolution process is performed by the solvent having lower permeability than the solvent used in the strong dissolution. Therefore, as shown in FIG. 5C, as the fine unevenness remaining in the resist pattern 9 after the strong dissolution process is performed is removed, the surface of the resist pattern 9 is more planarized. The agent liquid used in the process of FIG. 2D is not limited to the ethyl lactate, but it is required to have the property that it is difficult for the agent liquid to permeate the surface layer of the resist pattern as compared with the first solvent.

In the above-described embodiment, the surface of the resist pattern 9 is initially dissolved by the first solvent having higher permeability into the resist pattern 9 and then the first solvent is volatilized, thereby planarizing the surface with its unevenness roughly improved. Then, the surface of the resist pattern 9 is dissolved by the second solvent having lower permeability into the surface of the resist pattern 9 and the solvent is volatilized, thereby planarizing the surface such that its remaining fine unevenness is further improved. That is, in this embodiment, both the strong planarization process (improvement processing of surface roughness) and the weak planarization process are performed. Accordingly, as compared with a case in which the surface of the resist pattern 9 is processed only by a solvent having high permeability, the breakdown of the resist pattern 9 is suppressed, and particularly, the resist pattern 9 is less likely to be breakdown when it is weak. In addition, when the surface of the resist pattern 9 is processed only by a solvent having low permeability, it is necessary to repeat the dissolution of the surface by the solvent and the volatilization of the solvent. Accordingly, this embodiment has an advantage even in terms of throughput. Although the preprocessing performed before the first process is not necessary, since the preprocessing agent is used to make a degree of surface roughness of the resist pattern 9 small in advance in this embodiment, a processing enabling more enhanced surface roughness is possible.

Here, a selective example of a combination of the first solvent and the second solvent may include a combination of NMP and dimethyl sulfoxide (DMSO) and the like, in addition to a combination of the NMP (first solvent) and the ethyl lactate (second solvent).

The processing conditions have only to be set so that the dissolution process performed on the resist pattern 9 by the second solvent is performed under conditions of low permeability of the solvent into the resist pattern 9 as compared with the dissolution process performed on the resist pattern 9 by the first solvent. Accordingly, the first solvent and the second solvent are not limited to different kinds, and the first solvent and the second solvent may be the same kind, for example, both of them may be the NMP. In such a case, for example, the temperature of the wafer W when the solvent is supplied in the second dissolution process may be higher than when the solvent is supplied in the first dissolution process, or a solvent concentration in the second solvent gas atmosphere may be lower than that in the first solvent gas atmosphere. Under the processing conditions as described above, the absorption of the solvent into the resist pattern 9 when the second solvent is supplied is smaller than when the first solvent is supplied. Accordingly, it is possible to obtain the same result as the above-described embodiment in which the first solvent and the second solvent are different kinds.

In addition, although the dissolution process by the first solvent and the dissolution process by the second solvent have been performed while the substrate is heated, the heating may not be performed by adjusting respective processing conditions (processing parameters) so that the surface of the resist pattern 9 is not excessively dissolved. Further, the heating after the dissolution processes by the first solvent and the second solvent is a process for the purpose of sufficiently volatilizing the solvent remaining in the resist pattern 9. If the respective solvents can be sufficiently volatilized from the resist pattern surface, the heating after the dissolution processes may not be performed.

In addition, a mounting unit when the dissolution process by the first solvent may be separate or different from a mounting unit when the dissolution process by the second solvent. In this case, the respective mounting units may be set to have temperatures suitable for the respective processing conditions.

<Second Embodiment>

Figure 6:
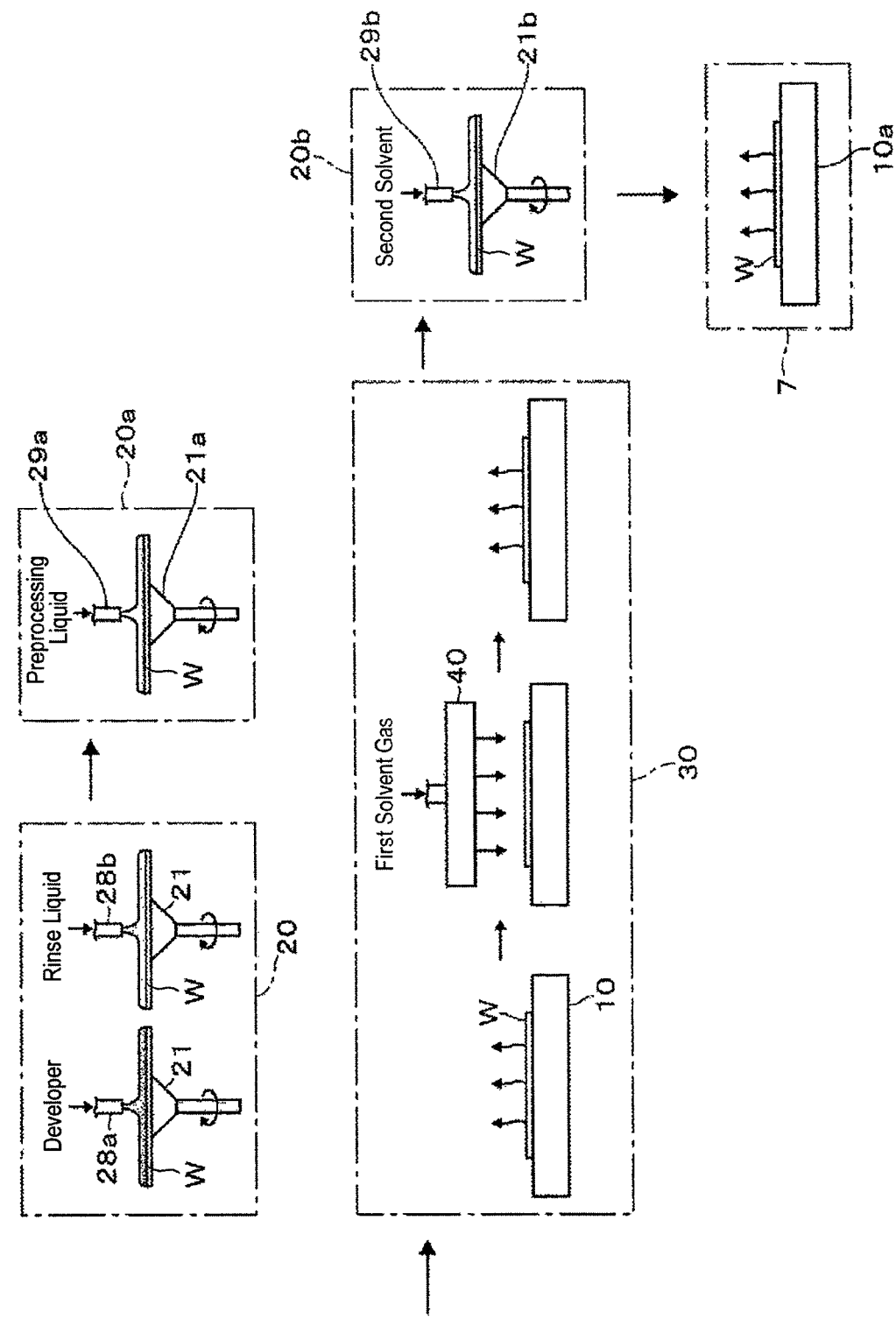
FIG. 6 is a view schematically showing a series of processes according to a second embodiment.

FIG. 6 shows a second embodiment of the present disclosure. One of the differences of the second embodiment from the first embodiment is that the supply of a preprocessing agent to the wafer W performed after the development processing is performed in a preprocessing liquid processing module 20a which is different from the development module 20. Such an example is effective in that, in the case that the developer is alkaline and the preprocessing agent is acidity, processes for discharging the process solutions may be separately performed. In FIG. 6, reference numeral 21a designates a spin chuck and reference numeral 29a designates a nozzle.

Further, in the second embodiment, when the dissolution process is performed on the resist pattern 9 using the second solvent, the second solvent is supplied in a liquid state to the wafer W by a liquid processing module 20b for the second planarization process. In FIG. 6, reference numeral 21b designates a spin chuck and reference numeral 29b designates a nozzle. Thereafter, the wafer W is mounted and heated, for example, on a mounting table 10a having a heater provided in a heating module 7.

With regard to other things not described herein, the second embodiment is the same as the first embodiment, and the same effects are obtained.

Further, in the second embodiment, while it has been described that the preprocessing agent is supplied in a liquid state, it may be supplied in a gaseous state instead of the liquid state.

<Third Embodiment>

Figure 7:
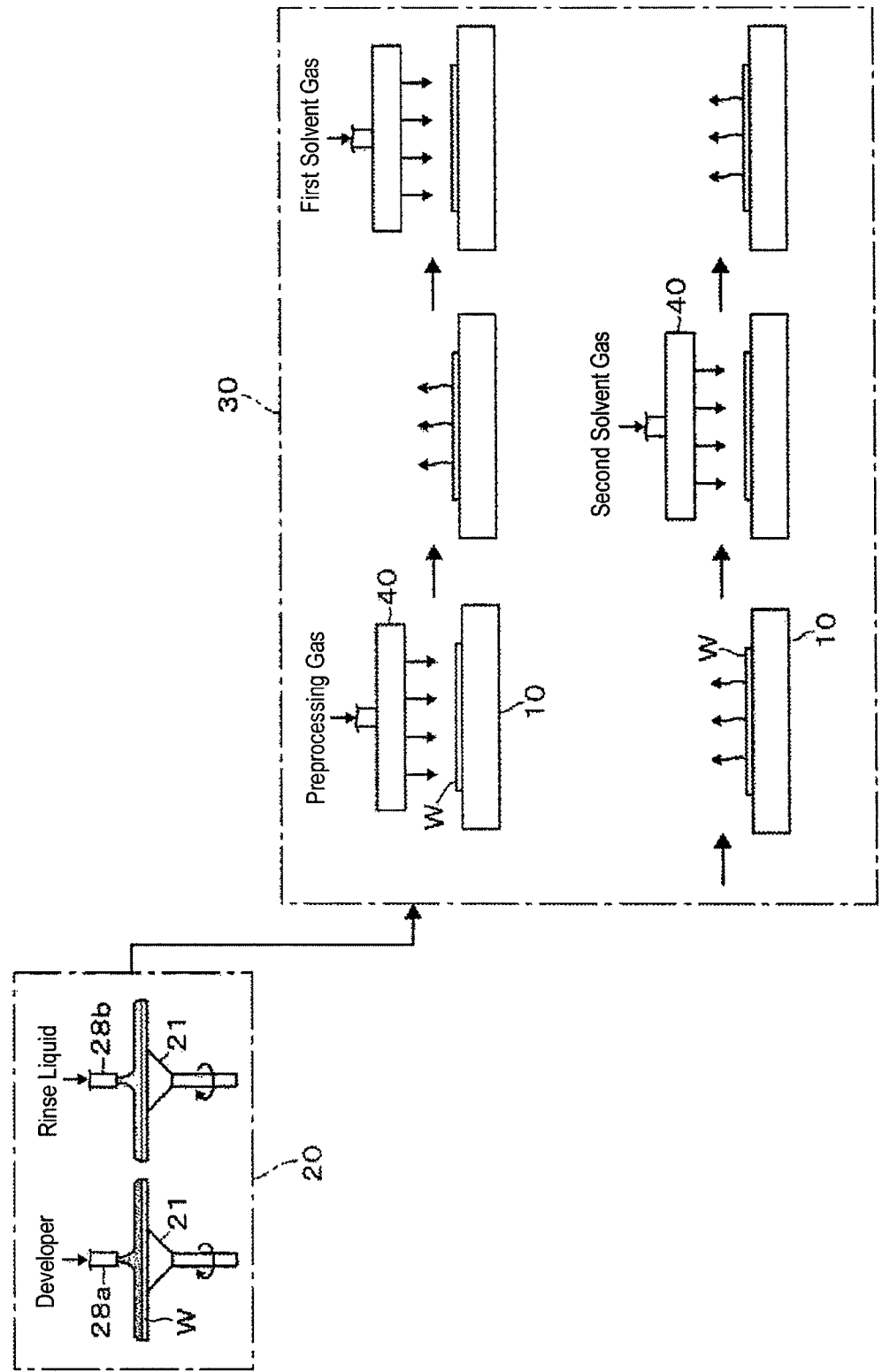
FIG. 7 is a view schematically showing a series of processes according to a third embodiment.

A third embodiment of the present disclosure will be described with reference to FIG. 7.

One of the differences of the third embodiment from the first embodiment is that the supply of a preprocessing agent to the wafer W performed after the development processing is performed in the planarization processing module 30 instead of the development module 20.

Other than that, the third embodiment is the same as the first embodiment, and the same effects are obtained.

In the first and second embodiments, the process by the first solvent and the process by the second solvent have been performed in the same planarization processing module 30. However, the respective processes may be performed in separate modules.

<A Configuration of Substrate Processing Apparatus>

An example of an entire configuration of a coating and developing apparatus according to the third embodiment of the present disclosure will be described with reference to FIGS. 8 to 12.

Figure 8:
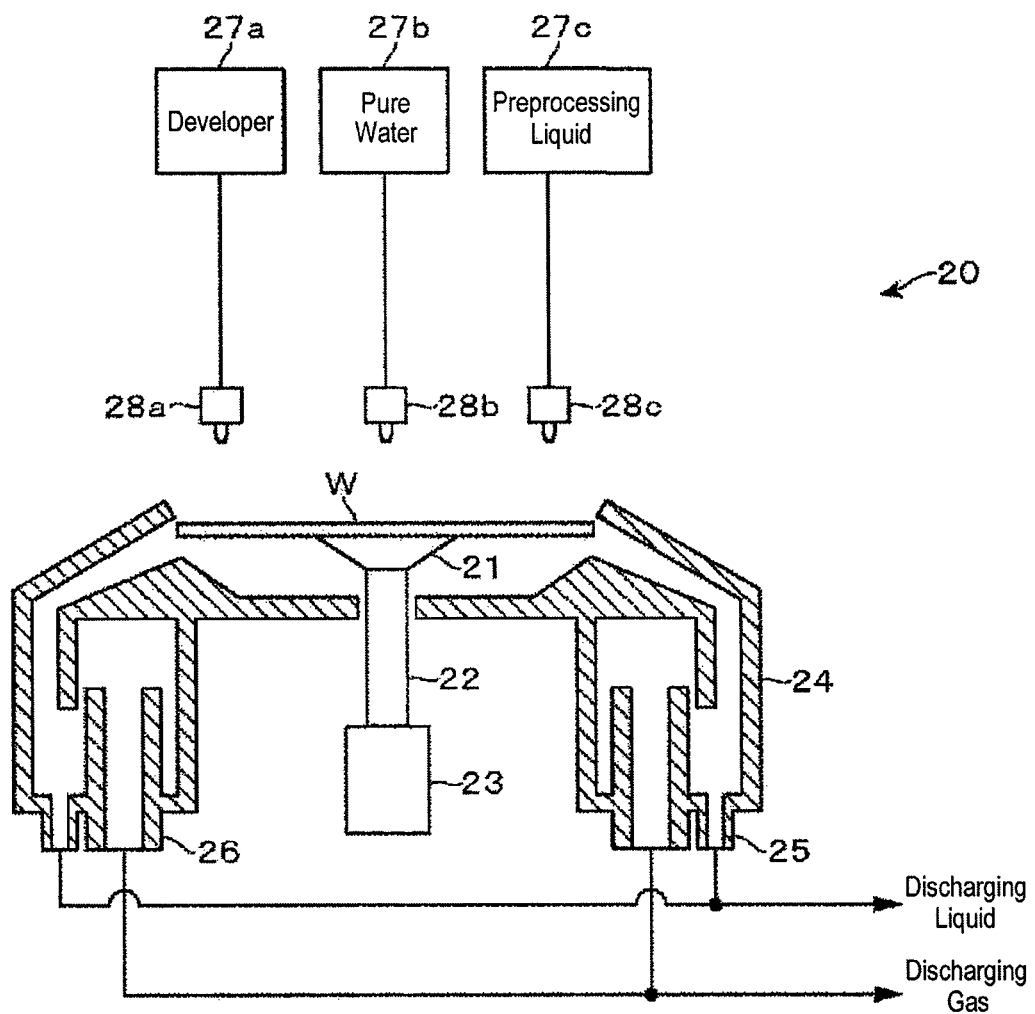
FIG. 8 is a side sectional view showing an example of a development module.

First, an example of the configuration of the development module 20 is shown in FIG. 8. The development module 20 is provided with the spin chuck 21, a rotating mechanism 23 configured to rotate the spin chuck 21 via a rotation shaft 22, and a cup unit 24 having a liquid discharging channel 25 and an exhaust channel 26 installed in a bottom thereof.

After the exposure processing is terminated, the wafer W is held by the spin chuck 21, and the development processing is performed by forming the puddle of developer on the wafer W while the developer nozzle 28a connected to a developer supply mechanism 27a is moved, for example, from a peripheral portion of the wafer W to a central portion thereof in the shape of a vortex. After the development processing is performed, the wafer W is cleaned by supplying a central portion of the wafer W with pure water from the rinse liquid nozzle 28b connected to a pure water supply mechanism 27b, in which a rinse liquid supply mechanism is present, while the spin chuck 21 is rotated. Then, when the cleaned wafer W is held by the spin chuck 21, the spin chuck 21 is rotated while a preprocessing agent is supplied to a central portion of the wafer W from an agent nozzle 28c connected to a preprocessing agent supply mechanism 27c. Accordingly, the preprocessing agent is spread on the wafer W.

Figure 9:
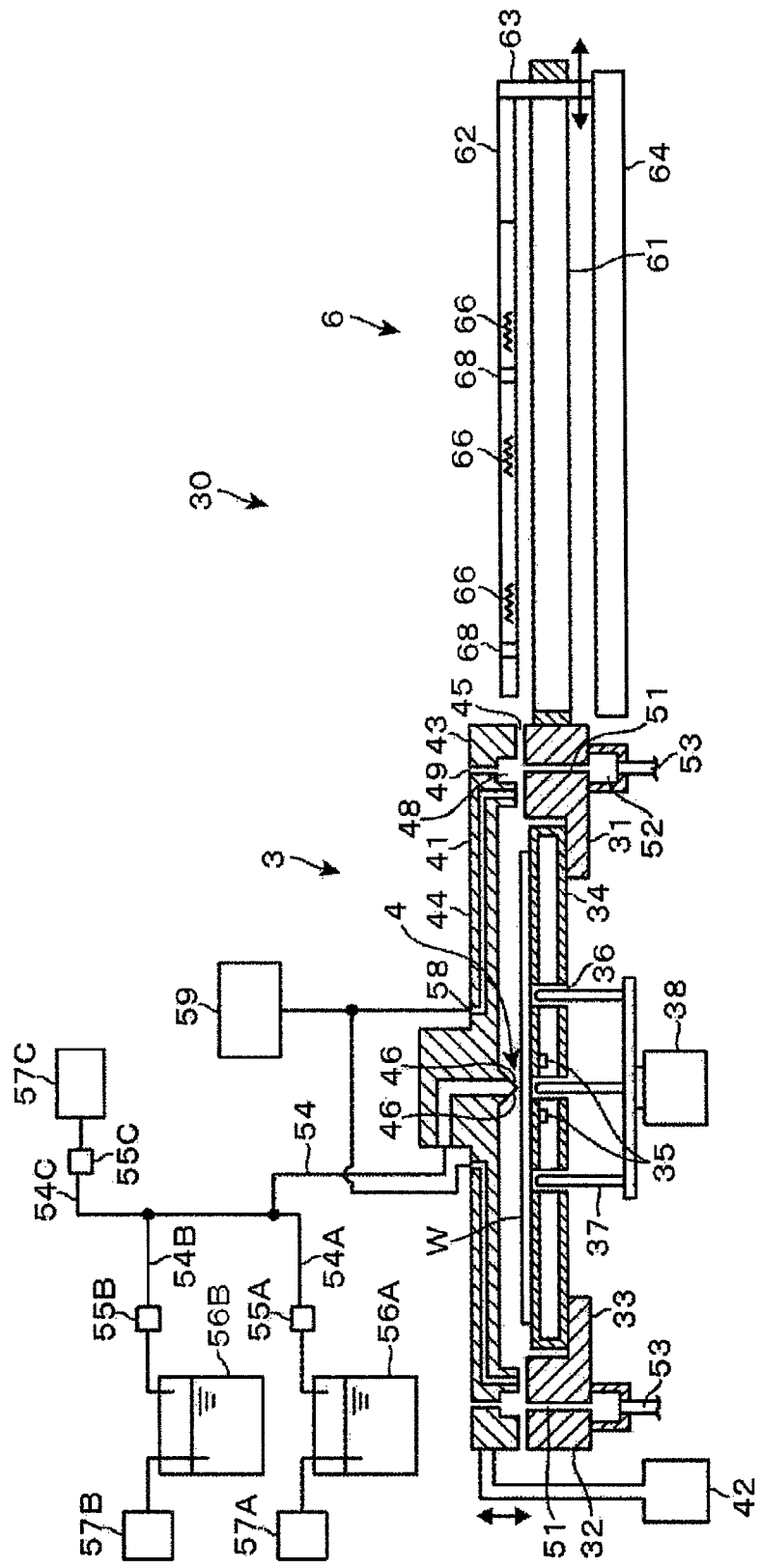
FIG. 9 is a side sectional view showing an example of a planarization processing module.

Then, the planarization processing module 30 will be described with reference to FIG. 9. The planarization processing module 30 is provided with a processing chamber 3 configured to process the wafer W, and a transfer mechanism 6 configured to transfer the wafer W that is a substrate between the processing chamber 3 and the outside of the planarization processing module 30.

The processing chamber 3 is formed in the shape of a flat circle and is provided with a chamber body 31 and a lid 41.

The chamber body 31 has a sidewall portion 32 forming a peripheral portion thereof, and a bottom wall portion 33, on which a mounting table 34 configured to be mounted with the wafer W is installed. A ring-shaped heater 35 is installed inside an upper surface of the mounting table 34 to serve as a temperature adjusting mechanism of the mounting table 34. Pins 37 are respectively inserted through three holes 36 provided in the mounting table 34 and protrude and retract from the mounting table 34 by a lifting mechanism 38, and the wafer W is transferred between the mounting table 34 and the transfer mechanism 6.

A plurality of purge gas ejection holes 51 is open on a surface of the sidewall portion 32 along the circumferential direction thereof. A ring-shaped space 52 in communication with the purge gas ejection holes 51 is formed under the sidewall portion 32, and one ends of a plurality of purge gas supply pipes 53 are connected to a lower portion of the space 52 to be spaced apart from each other at intervals in the circumferential direction. The other ends of the purge gas supply pipes 53 are connected to a supply mechanism (not shown) configured to feed a purge gas such as nitrogen gas, and the purge gas supplied to the space 52 from the supply mechanism is diffused into the space 52 and is ejected from the respective purge gas ejection holes 51.

The lid 41 is configured to be moved up and down by a lifting mechanism 42. The lid 41 has a sidewall portion 43 defining a peripheral portion thereof, and a top wall portion 44. When the wafer W is processed, the lid 41 is moved to a processing position shown in FIG. 9, and the lower end of the sidewall portion 43 and the upper end of the sidewall portion 32 of the chamber body 31 approach each other through a gap 45.

A central portion of a rear surface of the top wall portion 44 protrudes downward to define a gas supply unit 4. A plurality of gas ejection holes 46 is formed around the side of the gas supply unit 4 along the circumferential direction and ejects gas from a central portion of the wafer W mounted on the mounting table 34 toward the peripheral portion.

A downstream end of a gas supply pipe 54 is connected to an upper portion of the lid 41, and an upstream side of the gas supply pipe 54 is divided into three portions, which define gas supply pipes 54A, 54B and 54C. An upstream side of the gas supply pipe 54A is connected to a first solvent supply source 56A through a flow rate control mechanism 55A. The first solvent supply source 56A is a tank in which the first solvent capable of dissolving a resist is reserved and is connected to a nitrogen supply source 57A configured to supply nitrogen gas to a liquid phase of the reserved solvent. An upstream side of the gas supply pipe 54B is connected to a second solvent supply source 56B through a flow rate control mechanism 55B. The second solvent supply source 56B is a tank in which the second solvent is reserved and is connected to a nitrogen supply source 57B configured to supply nitrogen gas to the reserved solvent in a liquid phase. An upstream side of the gas supply pipe 54C is connected to a nitrogen supply source 57C, which feeds nitrogen gas that is a drying gas toward the downstream side, through a flow rate control mechanism 55C.

A ring-shaped concave portion 48 is formed at a position where it overlaps with the purge gas ejection holes 51 in the lower end of the sidewall portion 43 of the lid 41. The concave portion 48 is in gas communication with the upper portion of the lid 41 through a plurality of exhaust channels 49, which is formed in the surrounding direction of the wafer W. In addition, a plurality of exhaust holes 58 is arranged inside the concave portion 48 in the lower end of the sidewall portion 43 in the surrounding direction of the wafer W. The exhaust holes 58 are connected to an exhaust mechanism 59.

A base 61 is installed outside the processing chamber 3, and the transfer mechanism 6 is installed at the base 61. The transfer mechanism 6 includes a horizontal movable plate 62, a support portion 63 configured to support the movable plate 62 on the base 61, and a moving mechanism 64. The support portion 63 is stretched from the movable plate 62 below the base 61 and is connected to the moving mechanism 64. On the assumption that the position of the movable plate 62 shown in FIG. 9 is a standby position, the moving mechanism 64 causes the movable plate 62 to horizontally move between the standby position and a portion on top of the mounting table 34 of the processing chamber 3. In order not to obstruct this movement, the base 61 has a slit formed therein.

The movable plate 62 will be described. A heater 66 is installed inside the movable plate 62 to heat the wafer W mounted on a surface thereof to a predetermined temperature. The movable plate 62 has a slit formed therein, and the pins 37 for delivering the wafer W between the movable plate 62 and the mounting table 34 pass through the slit. In the figure, reference numeral 68 designates cutouts, which are formed to transfer the wafer W to/from a transfer arm (not shown) configured to transfer the wafer W to the planarization processing module 30.

The wafer W transferred into the planarization processing module 30 is mounted on the mounting table 34 in the processing chamber 3 by the transfer mechanism 6 and is heated by the heater 35 in order to volatilize the preprocessing agent. The first solvent gas is supplied to the heated wafer W from the first solvent supply source 56A by ejecting the nitrogen gas from the nitrogen supply source 57A. When the resist pattern surface of the wafer W is dissolved, the heater 35 is operated to heat the wafer W and volatilize the first solvent. Thereafter, the nitrogen gas is supplied from the nitrogen supply source 57C to substitute the atmosphere in the planarization processing module 30. Then, the second solvent gas is supplied from the second solvent supply source 56B by ejecting the nitrogen gas from the nitrogen supply source 57B. When the resist pattern surface of the wafer W is dissolved, the heater 35 is operated to heat the wafer W and volatilize the second solvent. Thereafter, the nitrogen gas is supplied from the nitrogen supply source 57C to substitute the atmosphere in the planarization processing module 30.

After the processes using the first and second solvents are completed, the wafer W is delivered from the top of the mounting table 34 to the top of the movable plate 62 by the pins 37 and the transfer mechanism 6 and is then unloaded out of the planarization processing module 30 from the top of the movable plate 62 by a transfer arm (not shown).

Figure 10:
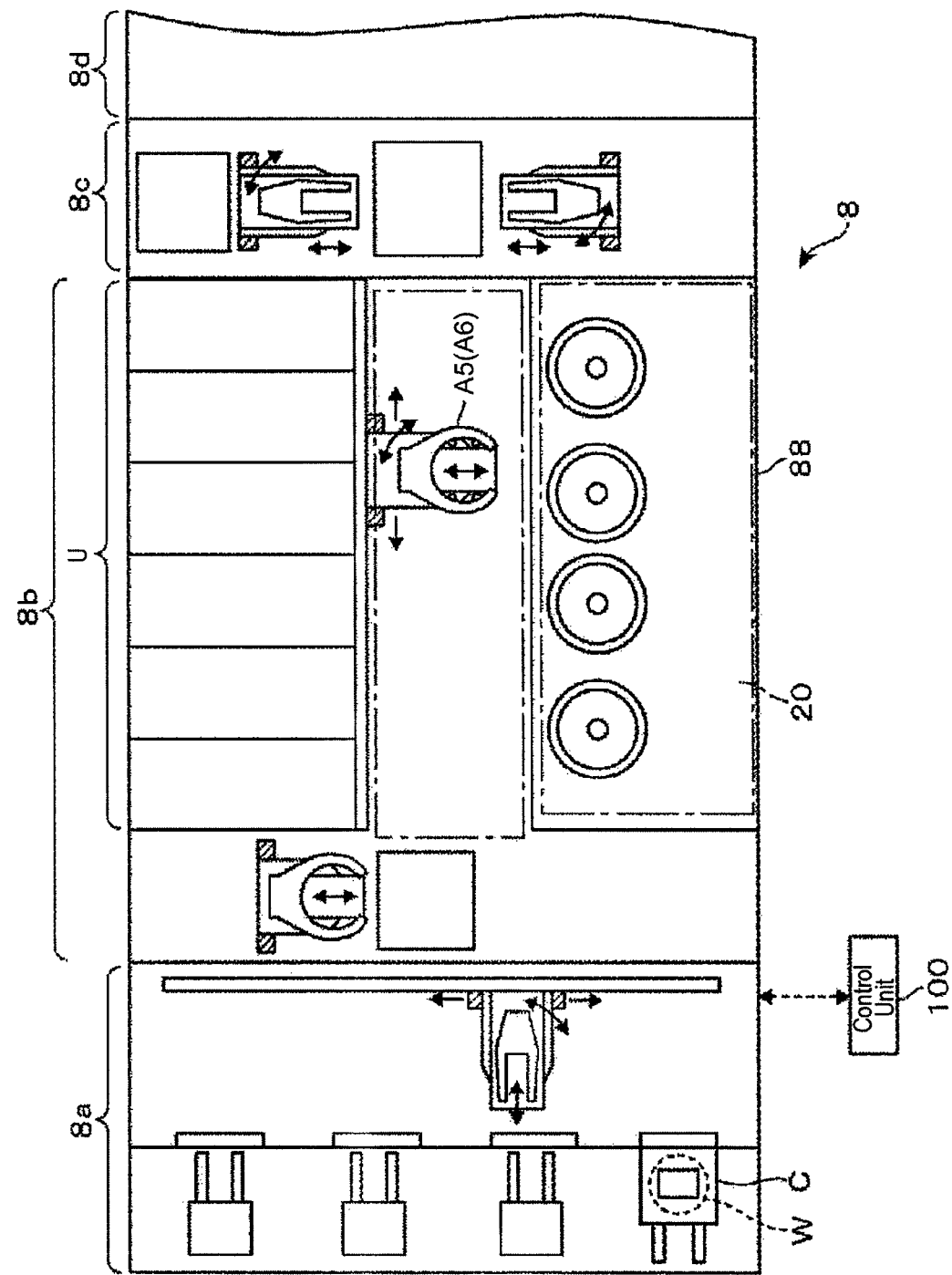
FIG. 10 is a plan view schematically showing a resist pattern forming apparatus as an example of an apparatus configuration.

Next, a coating and developing apparatus 8 as a resist pattern forming apparatus will be described with reference to FIG. 10. The coating and developing apparatus 8 is provided with a carrier block 8a, a processing block 8b, and an interface block 8c, wherein an exposure apparatus 8d is connected to the interface block 8c.

Figure 11:
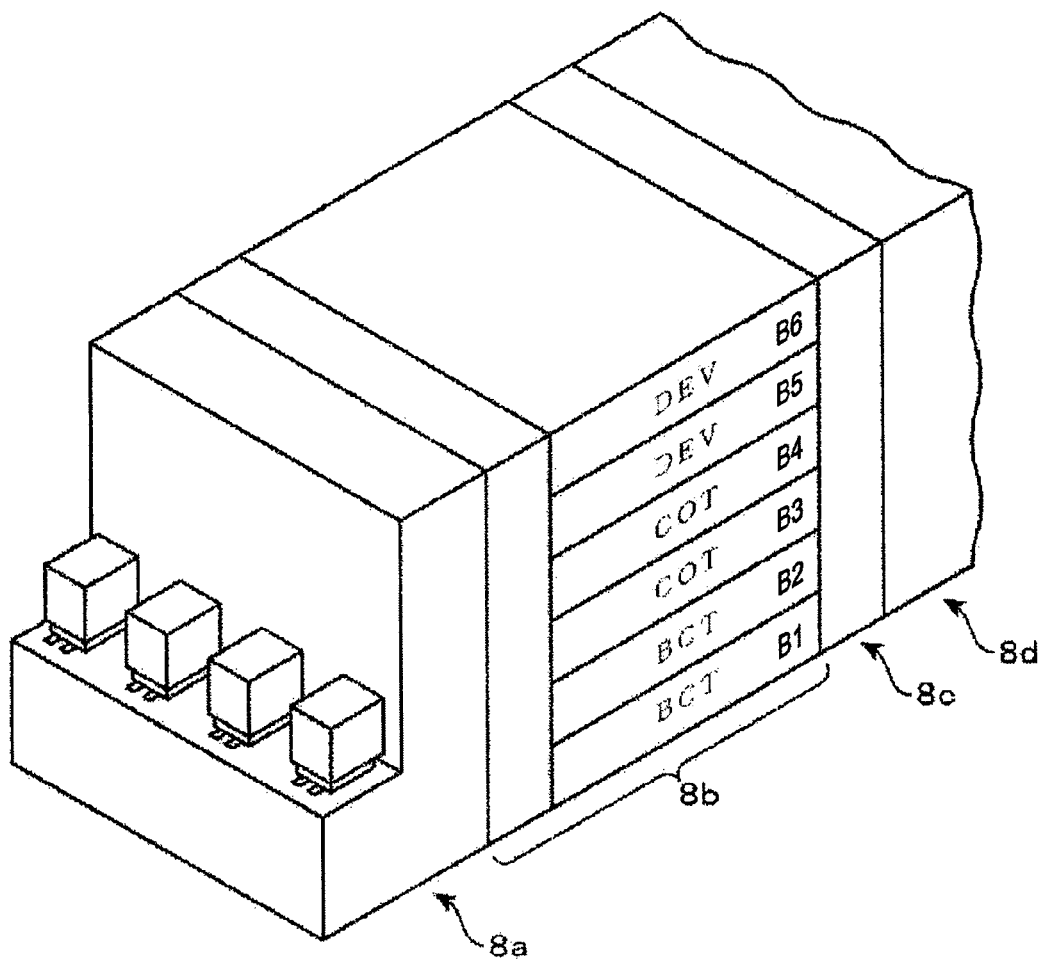
FIG. 11 is a perspective view schematically showing the resist pattern forming apparatus as the example of the apparatus configuration.

The processing block 8b will be described with reference to FIGS. 11 and 12. The processing block 8b is provided with first and second blocks (BCT floors) B1 and B2 configured to perform a process of forming a bottom anti-reflective film on a lower layer side of a resist film, third and fourth blocks (COT floors) B3 and B4 configured to perform a coating process of a resist liquid, and fifth and sixth blocks (DEV floors) B5 and B6 configured to perform a development process. That is, the processing block 8b is configured by stacking the respective blocks from below. In addition, each block is provided with a shelf unit U configured by stacking a heating unit or a cooling unit.

In succession, the overall flow of the wafer W in the coating and developing apparatus 8 will be described with reference to FIGS. 10 to 12.

The wafer W taken out from a carrier C is delivered to the processing block 8b and moves in the processing block 8b in the following order: the BCT floor (B1 or B2)→the COT floor (B3 or B4), being subjected to a necessary processing. The wafer W processed in the COT floor is loaded into the exposure apparatus 8d via the interface block 8c and is subjected to an exposure processing. The wafer W after the exposure processing is moved in the following order: the interface block 8c→the processing block 8b→the DEV floor (B5 or B6).

The DEV floors B5 and B6 will be described. Since development units 88 are stacked, for example, in a two-stage manner, transfer mechanisms A5 and A6 configured to transfer the wafer W to the two-staged development units 88 are installed in the fifth block and the sixth block B5 and B6, respectively. In addition, each of the development units 88 is provided with the development module 20 (corresponding to the development module 20 of the first embodiment). The preprocessing agent nozzle 28c is installed in the development module 20. Further, in this example, apart from the development module 20, the planarization processing module 30 is housed, e.g., in a portion of the shelf unit U of the sixth block B6. In addition, a module configured to heat the wafer W after the exposure processing and a module configured to heat the wafer W after the development processing are housed in the other portion of the shelf unit U of the sixth block B6.

Figure 12:
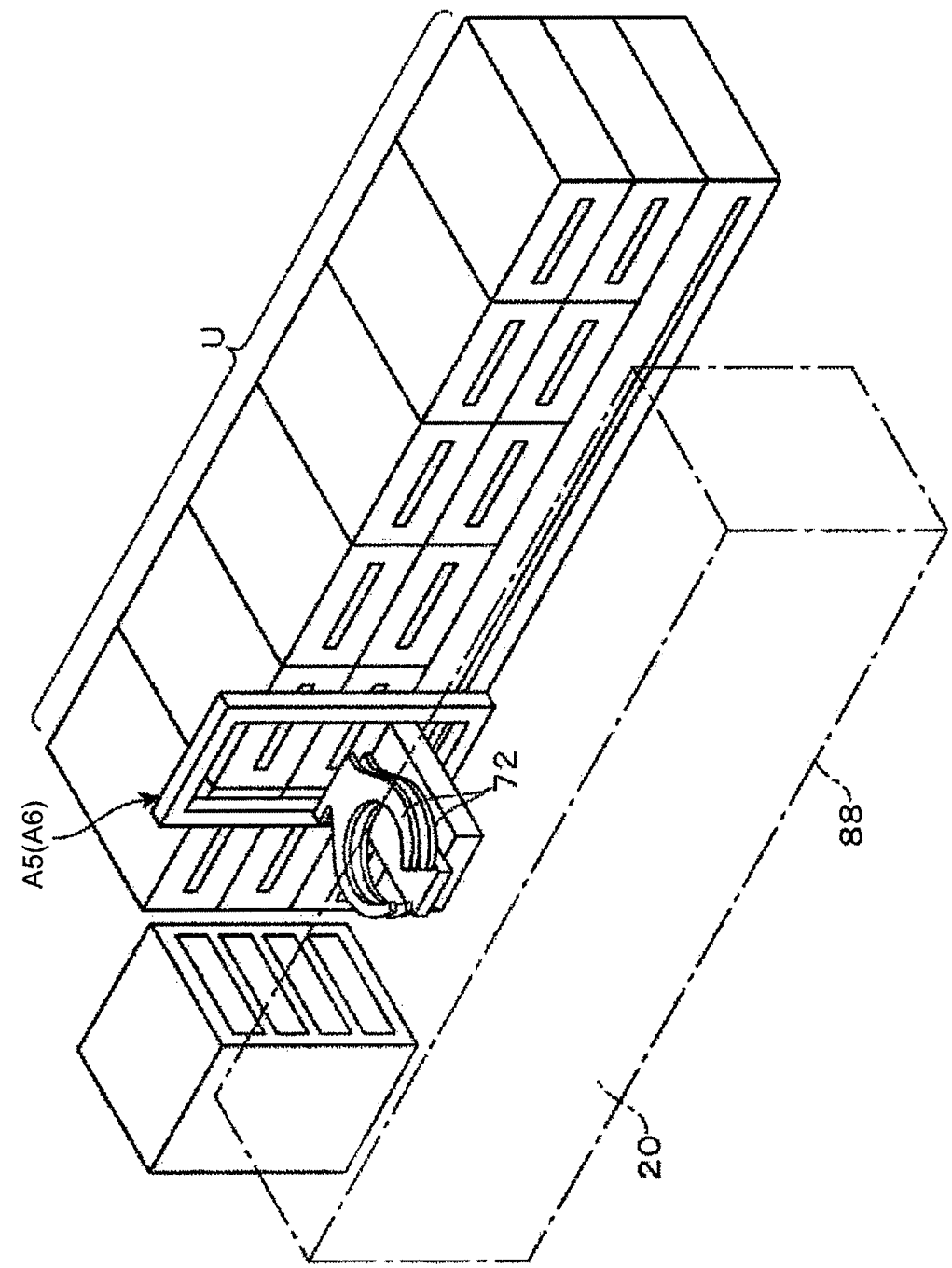
FIG. 12 is a perspective view of a shelf unit as an example of the apparatus configuration.

The wafer W loaded in the fifth block B5 or the sixth block B6 is mounted on the transfer mechanism A5 (A6) of FIG. 12, is transferred to the module in the shelf unit U to be subjected to PEB (Post-exposure Bake) that is a heating process before the development processing, and is then loaded into the development module 20. In the development module 20, the wafer W is subjected to the development processing and the cleaning with a rinse liquid as described above, and then, a preprocessing agent is spread thinly and widely on the surface of the wafer W.

Then, the wafer W with the preprocessing agent spread thinly and widely on the surface thereof is delivered to the transfer mechanism A5 (A6), is loaded into the planarization processing module 30 in the shelf unit U, and is subjected to, for example, the processing described in the first embodiment. Thereafter, the wafer W is delivered to a transfer arm 72 of the transfer mechanism A5 (A6) and is transferred to the later stage module to be subjected to processing such as heating. The wafer W, which has been subjected to the above-described processing, is returned to the carrier block 8a from the processing block 8b and is loaded into the carrier C again.

The above-described coating and developing apparatus 8 is provided with a control unit (not shown) including a computer configured to control the operation of the respective transfer mechanisms, the exposure processing and development processing on the wafer W, the coating of the wafer W with an agent liquid, the heating and cooling of the wafer W, and the operation of the other coating and developing apparatus 8. In addition, the control unit stores a program consisting of command groups for the control necessary to perform the desired processing on the wafer W. This program is installed in the control unit through an external storage medium, e.g., a hard disk, a tape storage, a compact disk, a magneto-optical disk, a memory card, or the like.

In succession, an example of the configuration of a coating and developing apparatus 8 corresponding to the second embodiment will be described in brief. The preprocessing liquid processing module 20*a* is installed separate from the development module 20, and the liquid processing module 20*b* for the second planarization process and the heating module 7 are configured inside the shelf unit U. The preprocessing liquid processing module 20*a* has approximately the same configuration as the development module 20. As long as the wafer W is heated, the configuration of the heating module 7 is not limited to the heater heating by a heating plate. For example, an LED (light emitting diode) may be installed in the module, and the wafer W may be irradiated with light energy from the LED to be heated.

Further, an example of the configuration of a coating and developing apparatus 8 corresponding to the third embodiment will briefly be described. A mechanism configured to supply the surface of the wafer W with the preprocessing agent in a gaseous state is added to the planarization processing module 30 in the first embodiment.

The above-described apparatus configurations can be appropriately selected and modified according to the properties of the respective first and second solvents.

According to the present disclosure, when a process of improving surface roughness of a pattern mask formed on a substrate using solvents is performed, first, a strong planarization process on the surface of the pattern mask (process of improving surface roughness of the pattern mask) is performed under conditions of high permeability of a solvent. Next, a weak planarization process on the surface of the pattern mask is performed under conditions of low permeability of a solvent. Since the surface roughness of the pattern mask can be satisfactorily improved, it is possible to suppress a breakdown of the pattern even though the pattern mask is weak. In addition, high throughput can be obtained as compared with a case where a process is repeated under conditions of low permeability of a solvent.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method performed to improve surface roughness of a pattern mask formed on a substrate by being exposed and developed, the method comprising:
   performing a preprocessing, the preprocessing including:
      supplying a preprocessing agent to the substrate to attach a liquid film onto a surface of the pattern mask;
      heating the substrate to dry the liquid film; and
      planarizing the surface by cohesive force generated on the surface of the pattern mask when the liquid film is dried;
   supplying a first solvent in a gaseous state to the surface of the substrate to dissolve the pattern mask after performing the preprocessing; and
   supplying a second solvent to the surface of the substrate, which is supplied with the first solvent, to dissolve the pattern mask,
   wherein a permeability of the second solvent is lower than a permeability of the first solvent.

2. The method of claim 1, wherein the first solvent and the second solvent are different from each other in kind.

3. The method of claim 1, wherein the second solvent has a concentration lower than a concentration of the first solvent.

4. The method of claim 1, wherein a temperature of the substrate when dissolving the pattern mask by supplying the second solvent is higher than a temperature of the substrate when dissolving the pattern mask by supplying the first solvent.

5. The method of claim 1, wherein supplying the first solvent is performed while the substrate is heated.

6. The method of claim 1, wherein supplying the second solvent is performed while the substrate is heated.

7. The method of claim 1, further comprising heating the substrate after supplying the first solvent and before supplying the second solvent.

8. The method of claim 1, further comprising heating the substrate after supplying the second solvent.

9. The method claim 1, wherein the second solvent is ethyl lactate.

10. The method claim 1, wherein the second solvent is dimethyl sulfoxide (DMSO).

11. A non-transitory computer-readable storage medium configured to store a computer program to be used in a substrate processing apparatus configured to improve roughness of a pattern mask formed on a substrate by being exposed and developed,
    wherein the computer program performs the method of claim 1.

* * * * *